(12) United States Patent
Takimoto et al.

(10) Patent No.: US 7,485,924 B2
(45) Date of Patent: Feb. 3, 2009

(54) LATERAL DOUBLE-DIFFUSED FIELD EFFECT TRANSISTOR AND INTEGRATED CIRCUIT HAVING SAME

(75) Inventors: Takahiro Takimoto, Tenri (JP); Hiroki Nakamura, Osakasayama (JP); Toshihiko Fukushima, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 334 days.

(21) Appl. No.: 11/509,717

(22) Filed: Aug. 25, 2006

(65) Prior Publication Data

US 2007/0063271 A1      Mar. 22, 2007

(30) Foreign Application Priority Data

Aug. 31, 2005    (JP) ............................ P2005-251475

(51) Int. Cl.
*H01L 29/92* (2006.01)
(52) U.S. Cl. .................. 257/339; 257/335; 257/342; 257/346; 257/401
(58) Field of Classification Search ................. 257/328, 257/335–337, 339, 341, 344–346, 401
See application file for complete search history.

(56) References Cited

U.S. PATENT DOCUMENTS 5,374,843 A * 12/1994 Williams et al. ............ 257/492
5,585,294 A 12/1996 Smayling et al.
2004/0079991 A1 * 4/2004 Lin et al. .................... 257/335

FOREIGN PATENT DOCUMENTS

| JP | 8321614 A | 12/1996 |
|----|-----------|---------|
| JP | 9205202 A | 8/1997 |

* cited by examiner

*Primary Examiner*—Zandra Smith
*Assistant Examiner*—Paul E Patton
(74) *Attorney, Agent, or Firm*—Birch, Stewart, Kolasch & Birch, LLP

(57) ABSTRACT

In a lateral double-diffused field effect transistor of the present invention, a gate insulating film includes a first gate insulating film covering a source diffusion layer up to a region beyond the pattern of a body diffusion layer and a second gate insulating film having a film thickness larger than that of the first gate insulating film and covering a region closer to a drain diffusion layer than the region covered by the first gate insulating film. A boundary between the first gate insulating film and the second gate insulating film is composed of a straight portion parallel to a side of the pattern of the body diffusion layer and a corner portion surrounding an vertex of the pattern of the body diffusion layer from a distance. A distance between the vertex of the pattern of the body diffusion layer and the corner portion of the boundary is equal to or smaller than a distance between the side of the pattern of the body diffusion layer and the straight portion of the boundary.

7 Claims, 7 Drawing Sheets ic equipment, semiconductor devices used therefor are diversified and the semiconductor devices are required to have high breakdown voltage, high power, downsizing, and low power consumption. In order to accomplish the lower power consumption, transistors with low on-resistance are necessary.

LATERAL DOUBLE-DIFFUSED FIELD EFFECT TRANSISTOR AND INTEGRATED CIRCUIT HAVING SAME

This Nonprovisional application claims priority under 35 U.S.C. §119(a) on Patent Application No. 2005-251475 filed in Japan on Aug. 31, 2005, the entire contents of which are hereby incorporated by reference.

BACKGROUND OF THE INVENTION

The present invention relates to a lateral double-diffused field effect transistor, and typically relates to a lateral double-diffused MOS transistor.

The present invention also relates to an integrated circuit having such a lateral double-diffused field effect transistor.

In recent years, with progress of multifunctional electronic equipment, semiconductor devices used therefor are diversified and the semiconductor devices are required to have high breakdown voltage, high power, downsizing, and low power consumption. In order to accomplish the lower power consumption, transistors with low on-resistance are necessary.

FIG. 6 shows a cross sectional structure of a general lateral double-diffused MOS transistor (see, e.g., JP H08-321614 A). The lateral double-diffused MOS transistor is an N-channel MOS transistor, which is formed on a lightly-doped N-well diffusion layer 102 provided on the surface of a P-substrate 101. The lateral double-diffused MOS transistor is composed of a P-body diffusion layer 103, a gate electrode 105 formed over the surfaces of an N+ source diffusion layer 106 and the N-well diffusion layer 102 through a gate oxide 104, as well as the N+ source diffusion layer 106 and an N+ drain diffusion layer 107 formed in a self-aligning way across the gate electrode 105. A region which is a surface portion immediately below the gate electrode 105 in the p-body diffusion layer 103 and which is between the N+ source diffusion layer 106 and the N-well diffusion layer 102 is a channel region, while a surface portion of the N-well diffusion layer 102 is a drift drain region. It is to be noted that the p-body diffusion layer 103 is short-circuited to the N+ diffusion layer 106 through a P+ diffusion layer 108 by an unshown interconnection. Thus, the p-body diffusion layer 103 and the N+ source diffusion layer 106 are made equal in potential, by which the operation of a parasitic NPN transistor is prevented.

FIG. 7A shows a plan pattern layout of a gate electrode G, a source diffusion layer S and a drain diffusion layer D in a general lateral double-diffused MOS transistor. In the plan pattern layout, the source diffusion layer S and the drain diffusion layer D, which extend in one direction (vertical direction in FIG. 7A) in parallel with each other, are placed alternately in a direction perpendicular to the one direction. The gate electrode G covers the channel region between the source diffusion layer S and the drain diffusion layer D.

The on-resistance of the MOS transistor is in close relationship with its size, that is, the larger size can reduce the on-resistance, although this causes increase in chip size and manufacturing costs. Therefore, the performance of the transistors is generally discussed based on on-resistance Ron*A per unit area. In order to reduce the Ron*A, a plan pattern layout as shown in FIG. 7B has been proposed. In this plan pattern layout, the source diffusion layer S and the drain diffusion D are square regions, and the drain diffusion layers D are placed so as to face four sides of a given source diffusion layer S. In such a case, a number of drain current flowing routes are secured, and therefore the Ron*A can be reduced.

The lateral double-diffused MOS transistor is required to have low on-resistance with an identical area and high breakdown voltage of the drain. In the structure of FIG. 6, the breakdown voltage (meaning drain breakdown voltage as hereinbelow) is determined by a distance between the p-body diffusion layer 103 and the N+ drain diffusion layer 107 (a length of the drift drain region) and by the concentration of the N-well diffusion layer 102. The longer drift drain region and the lower concentration of the N-well diffusion layer 102 increase the breakdown voltage. If the on-resistance is reduced with an identical area by, for example, increasing the concentration of the N-well diffusion layer 102, then the breakdown voltage is decreased. It can be said that the breakdown voltage and the on-resistance is in a trade-off relationship.

In order to increase the length of the drift drain region with an identical area, conventionally there are proposals in which a portion of the N-well diffusion layer 102 along the N+ drain diffusion layer 107 is oxidized to form a LOCOS (local oxide) 110 as shown in FIG. 8 and in which a deep trench 111 is formed to further deepen the LOCOS 110 as shown in FIG. 9.

However, in the case of forming the LOCOS 110 as shown in FIG. 8 and FIG. 9, an electric field may concentrate on the edge of the LOCOS 110, resulting in decrease in the breakdown voltage. Particularly in the case of adopting the plan pattern layout of FIG. 7B, an electric field concentrates on the vicinity of the corner portions of the drain diffusion layer D, and so the breakdown voltage is further decreased. This causes a problem of inability in increasing the breakdown voltage.

SUMMARY OF THE INVENTION

An object of the present invention is to provide a lateral double-diffused field effect transistor with high breakdown voltage and low on-resistance.

Another object of the present invention is to provide an integrated circuit having such a lateral double-diffused field effect transistor.

In order to accomplish the objects, there is provided a lateral double-diffused field effect transistor in the present invention, comprising:

a second conductivity-type body diffusion layer formed on a surface of a first conductivity-type semiconductor layer with use of substantially a rectangular pattern;

a first conductivity-type source diffusion layer formed in a region of the body diffusion layer occupying a part of a surface of the body diffusion layer;

a first conductivity-type drain diffusion layer formed in a region of the surface of the first conductivity-type semiconductor layer surrounding the body diffusion layer from a distance; and a gate electrode covering at least the surface of the semiconductor layer between the source diffusion layer and the drain diffusion layer through a gate insulating film, wherein the gate insulating film includes a first gate insulating film covering the source diffusion layer up to a region beyond a pattern of the body diffusion layer and a second gate insulating film having a film thickness larger than that of the first gate insulating film and covering a region closer to the drain diffusion layer than the region covered by the first gate insulating film, wherein a boundary between the first gate insulating film and the second gate insulating film is composed of a straight portion parallel to a side of the pattern of the body diffusion layer and a corner portion surrounding an vertex of the pattern of the body diffusion layer from a distance, and wherein a distance between the vertex of the pattern of the body diffusion layer and the corner portion of the boundary is equal to or smaller than a distance between the side of the pattern of the body diffusion layer and the straight portion of the boundary.

In this case, for example, the "first conductivity-type" represents an N type while the "second conductivity-type" represents a P type. On the contrary, the "first conductivity-type" may represent a P type and the "second conductivity-type" may represent an N type.

In the lateral double-diffused field effect transistor of the present invention, the gate insulating film includes a first gate insulating film covering the source diffusion layer up to a region beyond a pattern of the body diffusion layer and a second gate insulating film having a film thickness larger than that of the first gate insulating film and covering a region closer to the drain diffusion layer than the region covered by the first gate insulating film. Therefore, in a portion of the surface of the semiconductor layer between the source diffusion layer and the drain diffusion layer, the portion being immediately below the straight portion of the boundary between the first gate insulating film and the second gate insulating film, an electric field during operation can be alleviated compared to the case where the gate insulating film is made only from the first gate insulating film.

Further, in a portion of the surface of the semiconductor layer between the source diffusion layer and the drain diffusion layer, the portion being immediately below the corner portions of the boundary between the first gate insulating film and the second gate insulating film, a distance between an vertex of the pattern of the body diffusion layer and a corner portion of the boundary is equal to or smaller than a distance between a side of the pattern of the body diffusion layer and a straight portion of the boundary. Consequently, an electric field during operation can be alleviated compared to the case where the former distance is larger than the latter distance. Therefore, the corner portion of the boundary will not reduce breakdown voltage (meaning drain breakdown voltage as hereinbelow).

As a result, the lateral double-diffused field effect transistor of the present invention has high breakdown voltage. Moreover, since the drain diffusion layer surrounds the source diffusion layer, the lateral double-diffused field effect transistor of the present invention has low on-resistance.

The first conductivity-type semiconductor layer should preferably be formed on a second conductivity-type semiconductor substrate. The presence of the semiconductor substrate can provide mechanical strength.

The first conductivity-type semiconductor layer may be a diffusion layer formed with impurity diffused on the surface of the second conductivity-type semiconductor substrate.

In the lateral double-diffused field effect transistor of one embodiment, the first conductivity-type semiconductor layer is an epitaxial layer formed on a second conductivity-type semiconductor substrate by epitaxial growth.

The lateral double-diffused field effect transistor in the embodiment is easily manufactured together with a bipolar transistor on an common semiconductor substrate.

In the lateral double-diffused field effect transistor of one embodiment, a LOCOS is formed, continuing to the second gate insulating film, in a region between the body diffusion layer and the drain diffusion layer and along the drain diffusion layer.

In the lateral double-diffused field effect transistor of the embodiment, the presence of the LOCOS (local oxide) makes it possible to substantially increase a length of the surface of the semiconductor layer (drift drain region) between the body diffusion layer and the drain diffusion layer with an identical area, and therefore higher breakdown voltage can be achieved.

It is to be noted that the film thickness of the LOCOS should preferably be larger than the film thickness of the second gate insulating film.

In the lateral double-diffused field effect transistor of one embodiment, each corner portion of the boundary is a line segment crossing aslant with two straight portions continuing to the corner portion.

In the lateral double-diffused field effect transistor of the embodiment, a distance between an vertex of the pattern of the body diffusion layer and a corresponding corner portion of the boundary is equal to or smaller than a distance between a side of the pattern of the body diffusion layer and a straight portion of the boundary.

In the lateral double-diffused field effect transistor of one embodiment, each corner portion of the boundary is a circular arc around a corresponding vertex of the pattern of the body diffusion layer.

In the lateral double-diffused field effect transistor of the embodiment, a distance between an vertex of the pattern of the body diffusion layer and a corresponding corner portion of the boundary is equal to a distance between a side of the pattern of the body diffusion layer and a straight portion of the boundary.

In the lateral double-diffused field effect transistor of one embodiment, a distance between the boundary and the LOCOS is constant along a direction surrounding the body diffusion layer.

In the lateral double-diffused field effect transistor of the embodiment, a distance between the boundary and the LOCOS is constant along the direction surrounding the body diffusion layer, and therefore higher breakdown voltage can be achieved.

Publicly known integrated circuits include one formed by mounting a first-type field-effect transistor having a certain drain breakdown voltage and a second-type field-effect transistor having a drain breakdown voltage higher than the drain breakdown voltage of the first-type field-effect transistor on an common semiconductor substrate in an integrated state. In such a integrated circuit, the film thickness of a gate insulating film in the second-type field-effect transistor is set to be larger than the film thickness of a gate insulating film in the first-type field-effect transistor in order to achieve high drain breakdown voltage.

Accordingly, an integrated circuit of the present invention comprises at least:

the lateral double-diffused field effect transistor according to claim 1; and first-type and second-type field-effect transistors having gate insulating films having substantially a constant film thickness and having drain breakdown voltage different from each other, each transistor being formed on an common semiconductor substrate, wherein the film thickness of the first gate insulating film in the lateral double-diffused field effect transistor is substantially identical to the film thickness of the gate insulating film in the first-type field-effect transistor having a certain drain breakdown voltage, and wherein the film thickness of the second gate insulating film in the lateral double-diffused field effect transistor is substantially identical to the film thickness of the gate insulating film in the second-type field-effect transistor having a drain breakdown voltage higher than the drain breakdown voltage of the first-type field-effect transistor.

In the integrated circuit of the present invention, a first gate insulating film of the lateral double-diffused field effect transistor in the present invention can be formed in concurrence with a gate insulating film of the first-type field-effect transistor, and further a second gate insulating film of the lateral double-diffused field effect transistor in the present invention can be formed in concurrence with a gate insulating film of the second-type field-effect transistor. Therefore, the manufacturing steps can be decreased and manufacturing costs can be reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention is hereinbelow described in detail in conjunction with the embodiments with reference to the drawings.

Figure 3A:
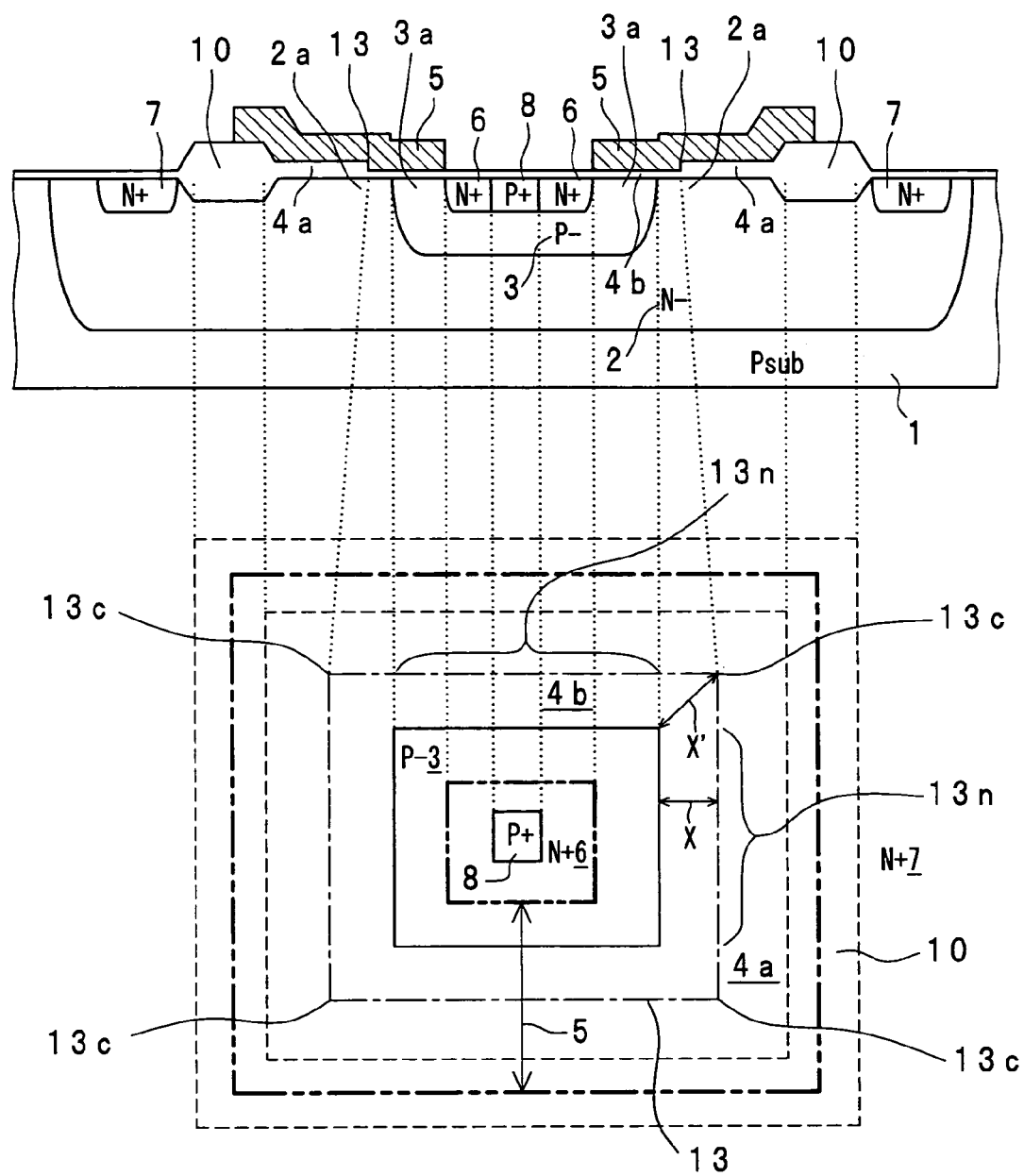
FIG. 3A is a view showing a cross sectional structure of the lateral double-diffused MOS transistor fundamental to the present invention and a plan pattern layout thereof corresponding to the cross sectional structure.

The upper half of FIG. 3A shows a cross sectional structure of a lateral double-diffused MOS transistor fundamental to the present invention, while the lower half of FIG. 3A shows a plan pattern layout of the lateral double-diffused MOS transistor corresponding to the cross sectional structure.

The lateral double-diffused MOS transistor, which is an N-channel MOS transistor, is formed on a lightly-doped N-well diffusion layer 2 formed with N-type impurity being diffused on the surface of a P-type substrate 1. The lateral double-diffused MOS transistor comprises a P-body diffusion layer 3 formed on the surface of the N-well diffusion layer 2 with use of a rectangular pattern, an N+ source diffusion layer 6 formed in the central section in the P-body diffusion layer 3 with use of a rectangular pattern, and an N+ drain diffusion layer 7 formed in a region of the surface of the N-well diffusion layer 2 surrounding the P-body diffusion layer 3 with use of a frame-like pattern.

A surface portion a of the N-well diffusion layer 2 between the N+ source diffusion layer 6 and the N+ drain diffusion layer 7 is covered with a gate electrode 5 patterned into a frame shape (inner and outer edges of the frame are shown by alternate long and two short dashes lines in the plan pattern layout) via gate oxides 4a, 4b serving as gate insulating films.

The gate oxides include a first gate oxide 4b covering the N+ source diffusion layer 6 up to a region beyond the pattern of the P-body diffusion layer 3 and a second gate oxide 4a having a film thickness larger than that of the first gate oxide 4b and covering a region closer to the N+ drain diffusion layer 7 than the region covered by the first gate oxide 4b.

A LOCOS (local oxide) 10 is formed, continuing to the second gate oxide 4a, in a region of the surface of the N-well diffusion layer 2 along the N+ drain diffusion layer 7. The LOCOS (local oxide) 10 has a film thickness larger than that of the second gate oxide 4a.

A region 3a which is a surface portion immediately below the gate electrode 5 in the P-body diffusion layer 3 and which is between the N+ source diffusion layer 6 and the N-well diffusion layer 2 constitutes a channel region, while a surface portion 2a of the N-well diffusion layer 2 constitutes a drift drain region. It is to be noted that the P-body diffusion layer 3 is short-circuited to the N+ source diffusion layer 6 via a P+ diffusion layer 8 through an unshown interconnection. Thus, the p-body diffusion layer 3 and the N+ source diffusion layer 6 are made equal in potential, by which the operation of a parasitic NPN transistor is prevented.

In addition, the lateral double-diffused MOS transistor has publicly-known electrodes, interconnections, field films and overcoats, though these component members are omitted in the drawings for simplification.

In an example in FIG. 3A, a boundary 13 between the first gate oxide 4b and the second gate oxide 4a forms a rectangular pattern corresponding to the size of a pattern of the P-body diffusion layer 3 expanded by X in four directions (upper, lower, left and right directions in the drawing). The pattern of the LOCOS 10 is in a frame shape, and its inner edge forms a rectangular pattern corresponding to a pattern of the boundary 13 expanded by a certain amount in four directions.

Figure 4:
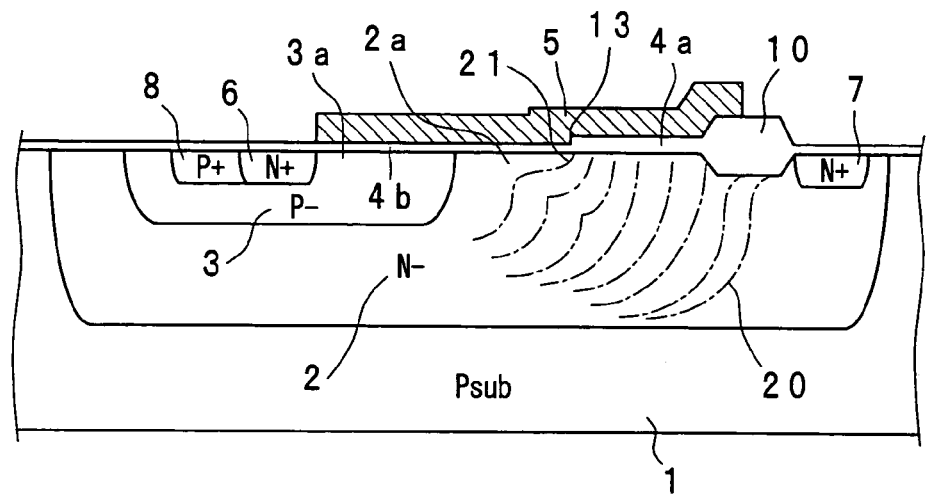
FIG. 4 is a view showing potential distribution in an N-well diffusion layer of the lateral double-diffused MOS transistor.

In this structure, the N-well diffusion layer 2 has potential distribution 20 as shown in FIG. 4 during operation. That is, an electric field 21 concentrates on immediately below the boundary 13 between the first gate oxide 4b and the second gate oxide 4a. As a result, a distance X from the P-body diffusion layer 3 to the boundary 13 exerts an influence on breakdown voltage (meaning drain breakdown voltage as hereinbelow) most, and the larger distance X decreases the breakdown voltage, whereas the smaller distance X increases the breakdown voltage.

In an example shown in FIG. 3A, corner portions 13c of the boundary 13 are on extensions of straight portions 13n corresponding to the sides of the pattern of the P-body diffusion layer 3. Therefore, at the corner portions 13c of the boundary 13, the distance X from the P-body diffusion layer 3 becomes larger (X'). Consequently, the corner portions 13c of the boundary 13 cause decrease in breakdown voltage of the entire device.

If the distance X is made so small that the P-body diffusion layer 3 and the second silicon oxide 4a overlap each other, a threshold voltage Vth changes and process dispersion becomes larger. Moreover, the smaller distance X signifies that a region occupied by the thin first gate oxide 4b is shortened, and since this causes an N-type inversion layer generated during power-on to be thin, the on-resistance is increased.

Figure 3B:
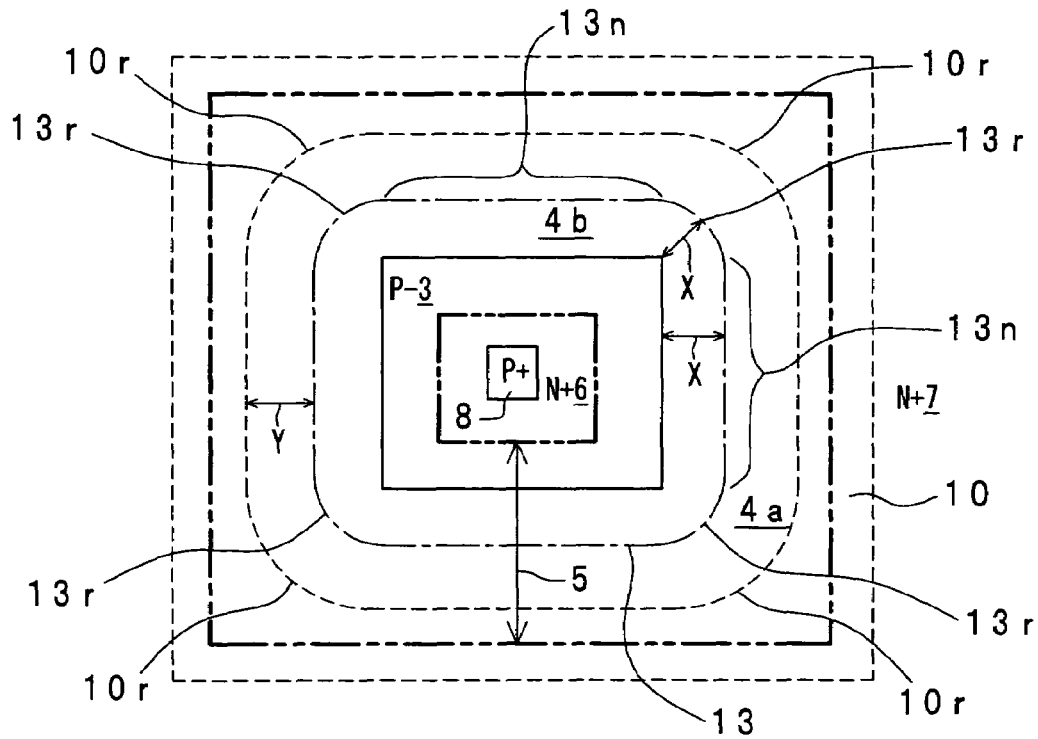
FIG. 3B is a plan pattern layout view showing a lateral double-diffused MOS transistor in one embodiment of the present invention.

Accordingly, in the lateral double-diffused MOS transistor in one embodiment of the present invention, as shown in FIG. 3B, each corner portion 13r of the boundary 13 is made to be a ¼ circular arc centering on each corresponding vertex of the pattern of the P-body diffusion layer 3. The pattern of the LOCOS 10 as a whole takes a frame shape, and its inner edge forms a pattern corresponding to the size of a pattern of the boundary 13 expanded by a specified amount Y in four directions (upper, lower, left and right directions in the drawing). That is, the respective corners 10r of the pattern of the LOCOS 10 take a shape of a ¼ circular which shares the same center with their corresponding corner portions 13r of the boundary 13. Other features are identical to those shown in FIG. 3A.

According to the structure, a distance X between an vertex of the pattern of the P-body diffusion layer 3 and its corresponding corner portion 13r of the boundary 13 is equal to a distance X between a side of the pattern of the P-body diffusion layer 3 and a straight portion 13n of the boundary 13. Consequently, compared to the case where the former distance is beyond the latter distance, the field effect during operation is alleviated. Therefore, the corner portions 13r of the boundary 13 will not decrease the breakdown voltage.

As a result, the lateral double-diffused MOS transistor gains high breakdown voltage. Moreover, the presence of the LOCOS 10 makes it possible to substantially increase the length of a drift drain region 2a with an identical area so that higher breakdown voltage is achieved. Moreover, since the lateral double-diffused MOS transistor has the N+ source diffusion layer 6 surrounded with the N+ drain diffusion layer 7, low on-resistance is achieved.

Figure 1:
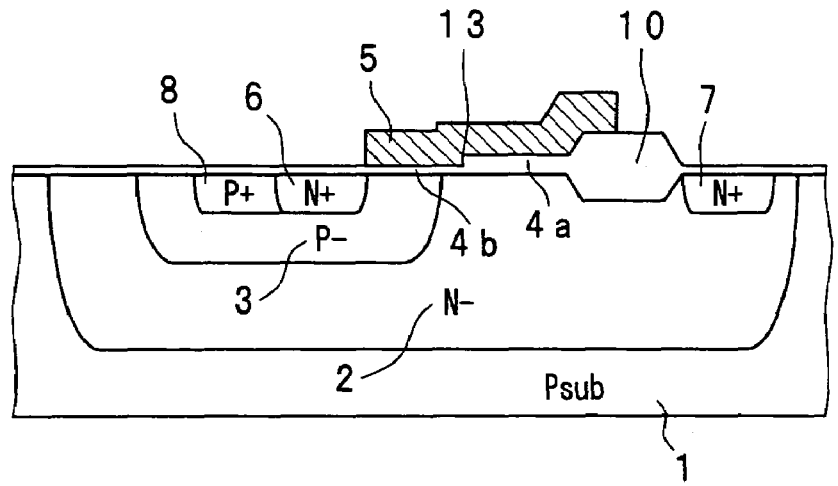
FIG. 1 is a simplified view showing a cross sectional structure of a lateral double-diffused MOS transistor in one embodiment of the present invention.

FIG. 1 shows the cross sectional structure of the lateral double-diffused MOS transistor shown in FIG. 3B with a left-hand side from the P+ diffusion layer 8 being omitted for simplification. Description is now given of a method for manufacturing the lateral double-diffused MOS transistor with reference to FIGS. 2A to 2D corresponding to FIG. 1.

Figure 2A:
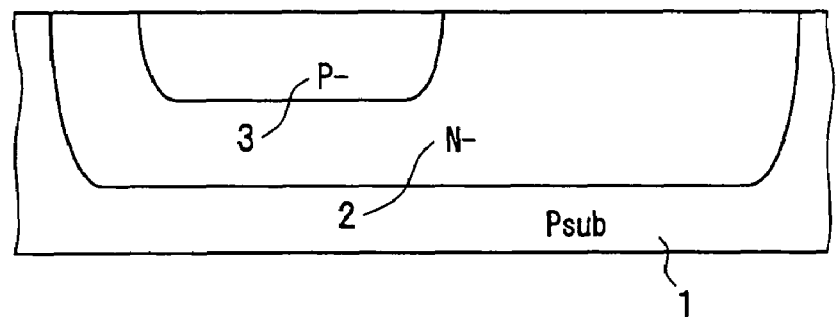
FIGS. 2A to 2D are views explaining the manufacturing steps for the lateral double-diffused MOS transistor.

First, as shown in FIG. 2A, phosphorus of approx. $1 \times 10^{13}$ atoms/cm$^2$ is ion-implanted into a P-type semiconductor substrate 1, and then drive-in treatment is conducted at 1200° C. for 600 min. to form an N-well diffusion layer 2. Then, boron of approx. $3 \times 10^{13}$ atoms/Cm$^2$ is ion-implanted to form a P-body diffusion layer 3 serving as a channel region.

Figure 2B:
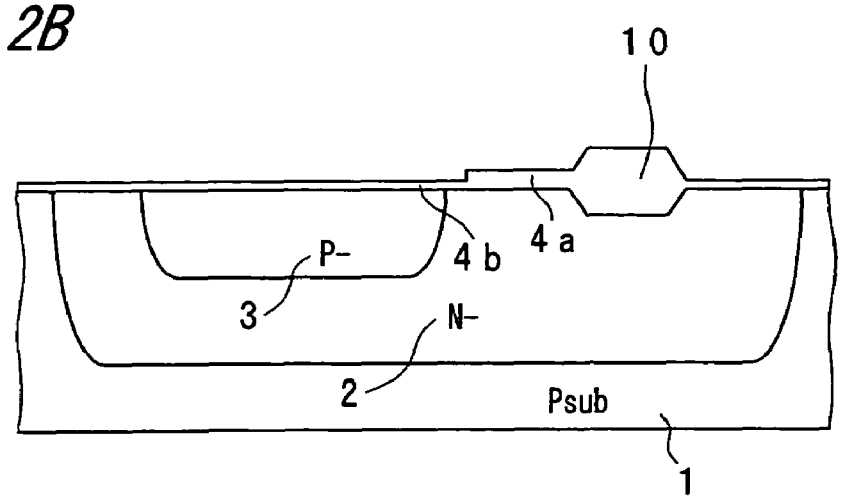

Next, as shown in FIG. 2B, oxidation is performed to form a silicon oxide 4a with a thickness of approx. 80 nm. On the substrate surface, an active region (region excluding a LOCOS 10 formation region) is covered with a silicon nitride, and LOCOS oxidation is performed to form a LOCOS 10 with the aforementioned pattern. Then, photolithography and etching are performed to remove the oxide in a region on the substrate surface where a silicon oxide 4b is to be provided. Then, oxidation is performed again to form the silicon oxide 4b with a thickness of approx. 30 nm.

Figure 2C:
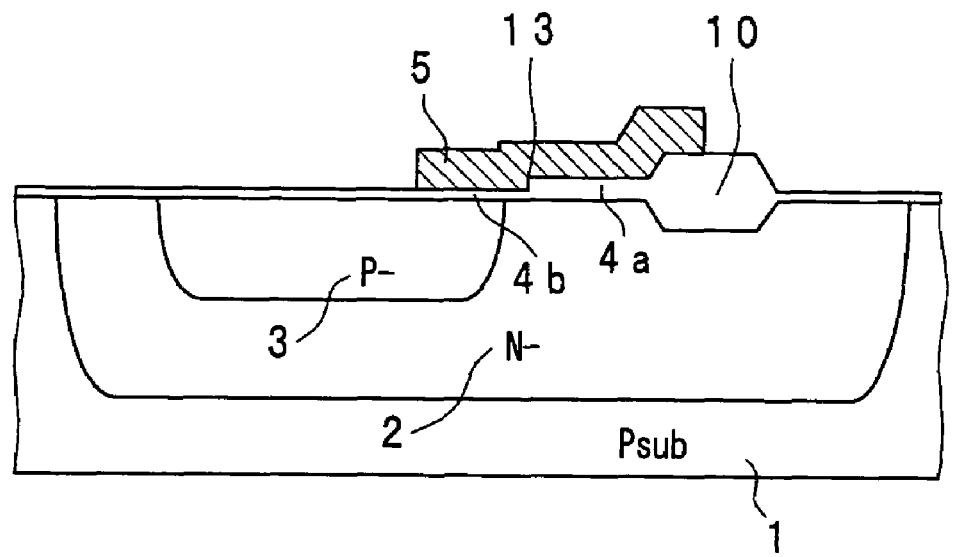

Next, as shown in FIG. 2C, a polysilicon 5 is formed so as to cover the silicon oxides 4a, 4b as gate oxides, and the polysilicon 5 is processed into a gate electrode pattern. A portion on the surface of the P-body diffusion layer 3 covered with the gate electrode 5 serves as the channel region. Since only the silicon oxide 4b exists between the gate electrode 5 and the channel region, only the silicon oxide 4b functions as the gate oxide in actuality. The silicon oxide 4a mainly functions to alleviate the electric field in the vicinity of the edge of the LOCOS 10 and to increase breakdown voltage.

Figure 2D:
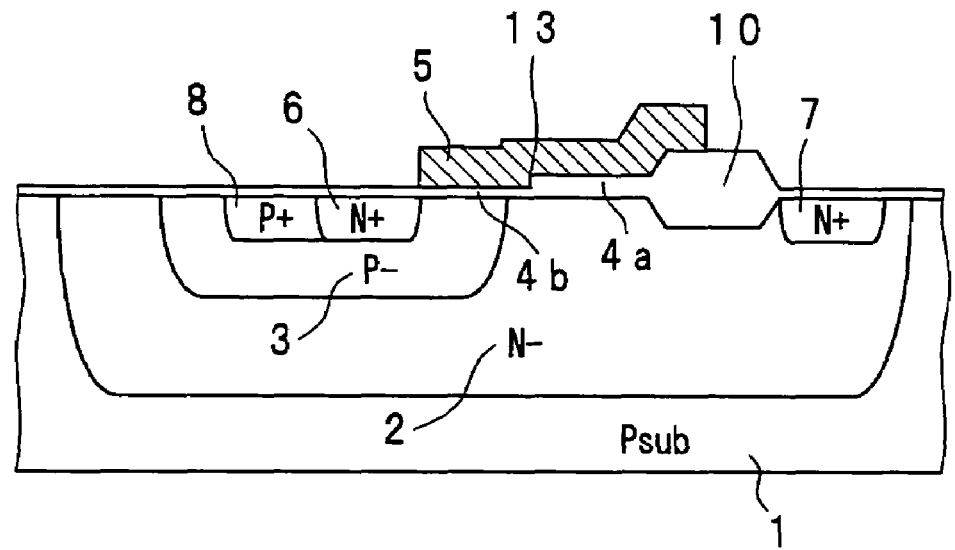

Next, as shown in FIG. 2D, phosphorus of approx. $6 \times 10^{15}$ atoms/cm$^2$ is ion-implanted in a self-aligning way relative to the gate electrode 5 so as to form an N+ source diffusion layer 6 and an N+ drain diffusion layer 7. Then, a P+ diffusion layer 8 is formed in order to stabilize the potential of the P-body diffusion layer 3. In order to prevent a parasitic NPN transistor from operating, the N+ source diffusion layer 6 and the P+ diffusion layer 8 are short-circuited by an unshown interconnection.

Thus, the lateral double-diffused MOS transistor is manufactured.

Figure 3C:
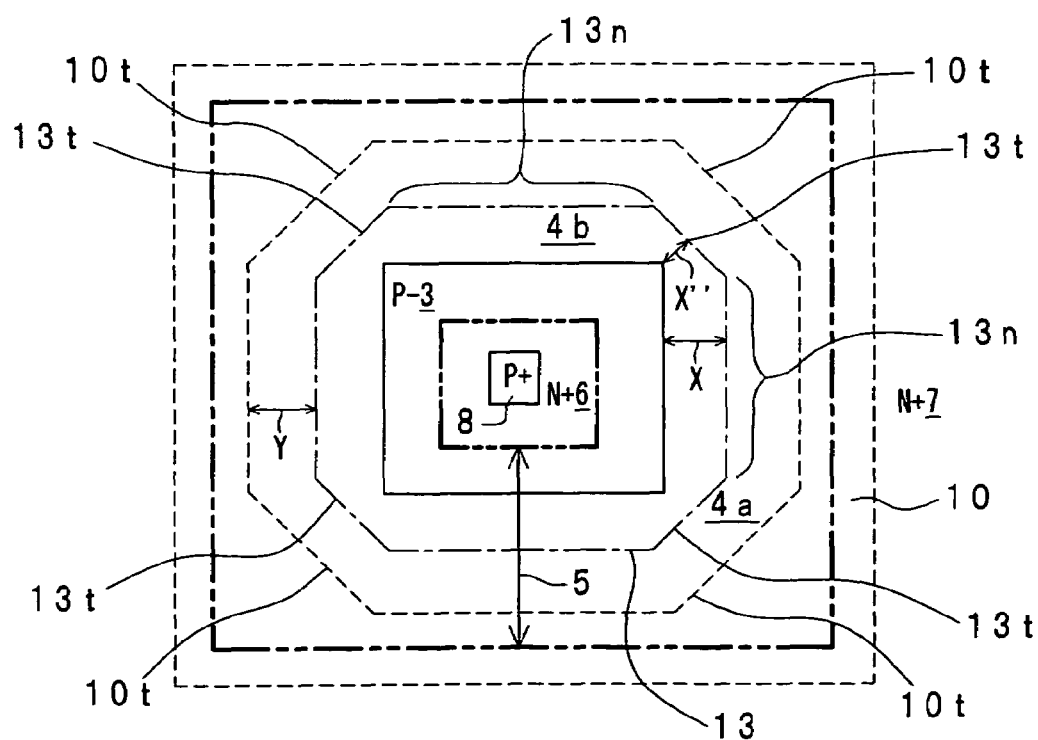
FIG. 3C is a plan pattern layout view showing a lateral double-diffused MOS transistor in another embodiment of the present invention.

FIG. 3C shows a plan pattern layout of a lateral double-diffused MOS transistor in another embodiment.

A corner portion of the boundary 13 between the first gate oxide 4b and the second gate oxide 4a may be close to the P-body diffusion layer 3 in the range that the corner portion do not overlap the P-body diffusion layer 3. Accordingly, in an example of FIG. 3C, each corner 13t of the boundary 13 may be a line segment crossing aslant with two straight portions 13n, 13n continuing to the corner portion 13t. Moreover, the inner edge of the LOCOS 10 forms a pattern corresponding to the size of a pattern of the boundary 13 expanded by a specified amount Y in four directions (upper, lower, left and right directions in the drawing). That is, each corner portion 10t of the pattern of the LOCOS 10 is in parallel with their corresponding corner portions 13t of the boundary 13. Other features are identical to those shown in FIG. 3B.

According to this structure, a distance X" between an vertex of the pattern of the P-body diffusion layer 3 and its corresponding corner portion 13t of the boundary 13 is equal to or smaller than a distance X between a side of the pattern of the P-body diffusion layer 3 and a straight portion 13n of the boundary 13. Consequently, compared to the case where the former distance X" is beyond the latter distance X, the field effect during operation is alleviated. Therefore, the corner portions 13r of the boundary 13 will not decrease the breakdown voltage.

As a result, the lateral double-diffused MOS transistor gains high breakdown voltage. Moreover, the presence of the LOCOS 10 makes it possible to substantially increase the length of the drift drain region 2a with an identical area so that higher breakdown voltage is achieved. Moreover, since the lateral double-diffused MOS transistor has the N+ source diffusion layer 6 surrounded with the N+ drain diffusion layer 7, low on-resistance is achieved.

Even if the corner portions 13t of the boundary 13 (i.e., second gate oxide 4a) should overlap the P-body diffusion layer 3 due to process dispersion caused by positioning in photolithography and the like, the range of the second gate oxide 4a occupying the P-body diffusion layer 3 is small. Consequently, an influence of the overlapping upon the threshold voltage Vth is small, and therefore the threshold voltage Vth does not undergo any substantial change. An influence of the overlapping upon the on-resistance is also small, and therefore the on-resistance does not undergo any substantial change either.

Figure 5:
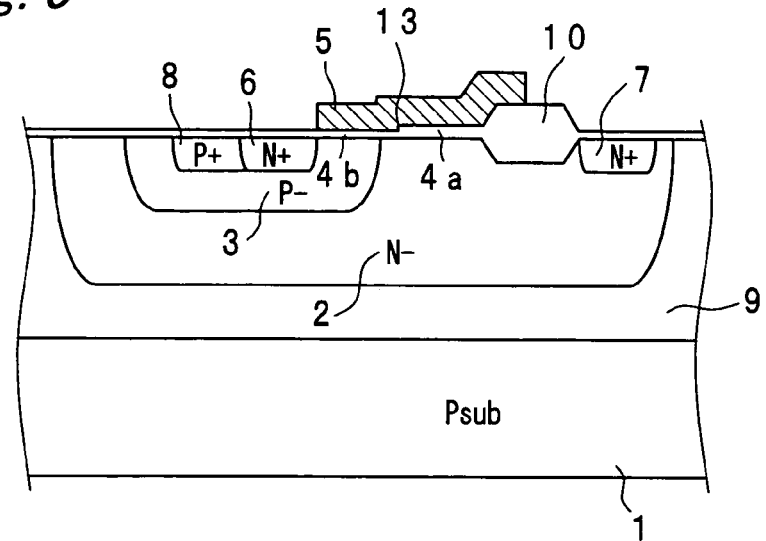
FIG. 5 is a view showing an example in which a lateral double-diffused MOS transistor is formed inside an N-type epitaxial layer on a P-type substrate.
Figure 6:
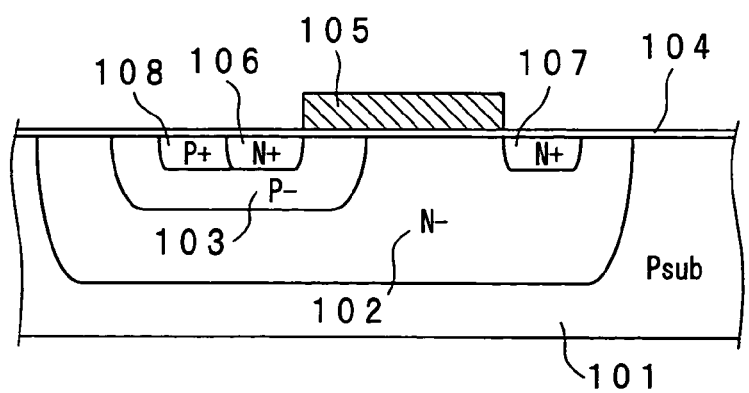
FIG. 6 is a view showing a cross sectional structure of a conventional lateral double-diffused MOS transistor.
Figure 7A:
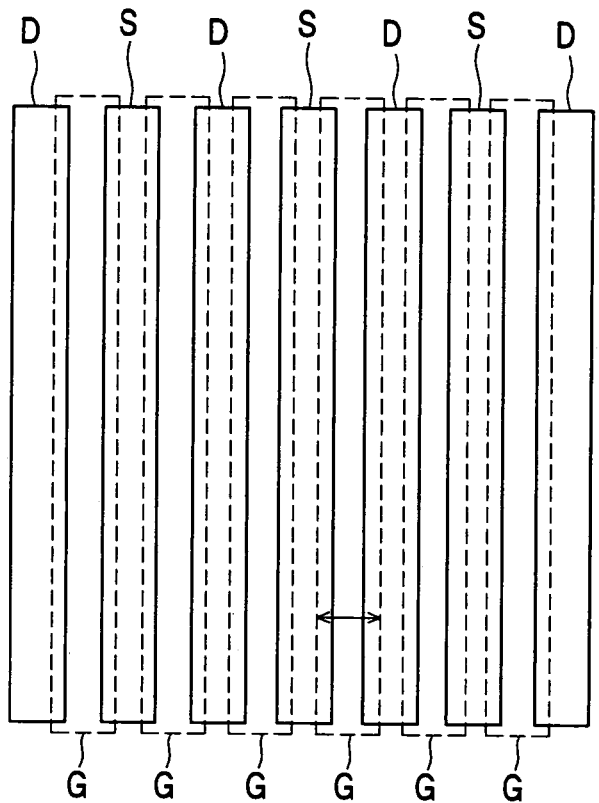
FIGS. 7A and 7B are views showing plan pattern layouts of conventional lateral double-diffused MOS transistors.
Figure 7B:
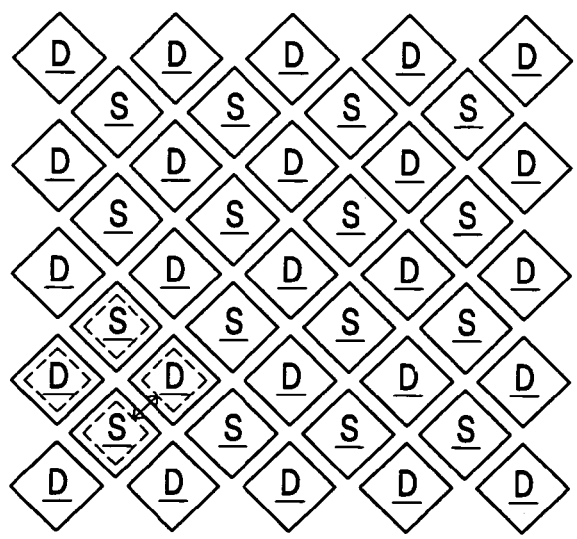
Figure 8:
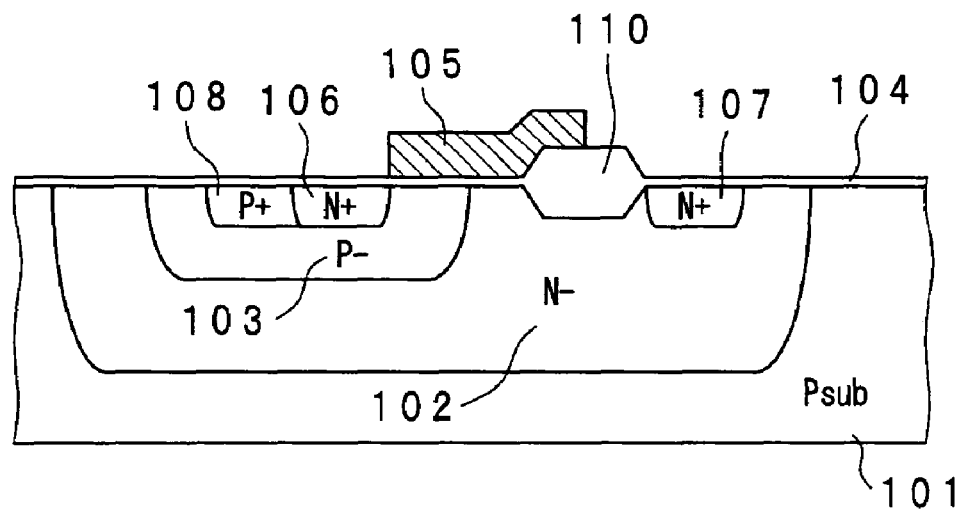
FIGS. 8 to 9 are views showing cross sectional structures of the conventional lateral double-diffused MOS transistors.
Figure 9:
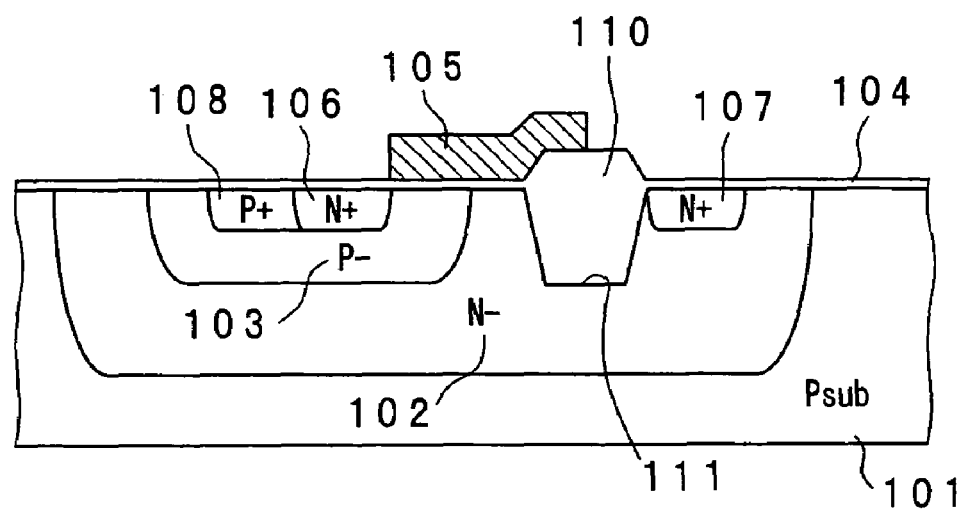

Although in each of the above examples, the lateral double-diffused MOS transistor is formed on the N-well diffusion layer 2 in the P-type semiconductor substrate 1, it should naturally be understood that the present invention is not limited thereto. For example, as shown in FIG. 5, the lateral double-diffused MOS transistor may be formed in an N-type epitaxial layer 9 formed on the P-type substrate 1. Although a left side portion from the P+ diffusion layer 8 is omitted in FIG. 5 as in FIG. 1 for simplification, the actual lateral double-diffused MOS transistor is structured to be symmetric with respect to the P-type diffusion layer 8.

Generally, when a MOS transistor and a bipolar transistor are mounted on an common semiconductor substrate in an integrated state, an N-type epitaxial layer 9 is sometimes formed on the semiconductor substrate for improving analog characteristics. In such a case, as shown in FIG. 5, an N-type drift drain region (N-well diffusion layer) 2 is formed in the N-type epitaxial layer 9, or the N-type epitaxial layer 9 is directly used as an N-type drift drain region depending on the concentration. Consequently, the lateral double-diffused MOS transistor can be manufactured together with the bipolar transistor on the common semiconductor substrate.

Although in each of the above examples, the lateral double-diffused MOS transistor is an N-channel MOS transistor, it should naturally be understood that the present invention is not limited thereto. The conductivity-type (N type and P type) of each portion may be interchanged to form a P-channel MOS transistor.

There is generally an integrated circuit having a first-type MOS transistor having a certain drain breakdown voltage (hereinbelow referred to as "normal MOS transistor") and a second-type MOS transistor having a drain breakdown voltage higher than the drain breakdown voltage of the first-type MOS transistor (hereinbelow referred to as "high breakdown voltage MOS transistor"), the respective transistors being mounted on an common semiconductor substrate in an integrated state. In such an integrated circuit, the film thickness of a gate insulating film in the high breakdown voltage MOS transistor is set to be larger than the film thickness of a gate insulating film in the normal MOS transistor in order to achieve high drain breakdown voltage.

In the case of incorporating the lateral double-diffused MOS transistor of one embodiment into such an integrated circuit, it is preferable to set the film thickness of the first gate oxide 4b in the lateral double-diffused MOS transistor to be substantially identical to the film thickness of the gate oxide in the normal MOS transistor and to set the film thickness of the second gate oxide 4a in the lateral double-diffused MOS transistor to be substantially identical to the film thickness of the gate oxide in the high breakdown voltage MOS transistor.

In such a case, the first gate oxide 4b of the lateral double-diffused MOS transistor can be formed in concurrence with the gate oxide of the normal MOS transistor, and the second gate oxide 4a of the lateral double-diffused MOS transistor can be formed in concurrence with the gate oxide of the high breakdown voltage MOS transistor. Therefore, the manufacturing steps can be decreased and manufacturing costs can be reduced.

In each of the aforementioned examples, the gate insulating film is a gate oxide, i.e., a silicon oxide, and the lateral double-diffused field effect transistor is a MOS transistor. However, it should naturally be understood that the present invention is not limited thereto, and other materials can be employed as the gate insulating film.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A lateral double-diffused field effect transistor, comprising:
 a second conductivity-type body diffusion layer formed on a surface of a first conductivity-type semiconductor layer with use of substantially a rectangular pattern;
 a first conductivity-type source diffusion layer formed in a region of the body diffusion layer occupying a part of a surface of the body diffusion layer;
 a first conductivity-type drain diffusion layer formed in a region of the surface of the first conductivity-type semiconductor layer surrounding the body diffusion layer from a distance; and
 a gate electrode covering at least the surface of the semiconductor layer between the source diffusion layer and the drain diffusion layer through a gate insulating film,
 wherein the gate insulating film includes a first gate insulating film covering the source diffusion layer up to a region beyond a pattern of the body diffusion layer and a second gate insulating film having a film thickness larger than that of the first gate insulating film and covering a region closer to the drain diffusion layer than the region covered by the first gate insulating film,
 wherein a boundary between the first gate insulating film and the second gate insulating film is composed of a straight portion parallel to a side of the pattern of the body diffusion layer and a corner portion surrounding an vertex of the pattern of the body diffusion layer from a distance, and
 wherein a distance between the vertex of the pattern of the body diffusion layer and the corner portion of the boundary is equal to or smaller than a distance between the side of the pattern of the body diffusion layer and the straight portion of the boundary.

2. The lateral double-diffused field effect transistor according to claim 1,
 wherein the first conductivity-type semiconductor layer is an epitaxial layer formed on a second conductivity-type semiconductor substrate by epitaxial growth.

3. The lateral double-diffused field effect transistor according to claim 1,
 wherein a LOCOS is formed, continuing to the second gate insulating film, in a region between the body diffusion layer and the drain diffusion layer and along the drain diffusion layer.

4. The lateral double-diffused field effect transistor according to claim 1,
 wherein each corner portion of the boundary is a line segment crossing aslant with two straight portions continuing to the corner portion.

5. The lateral double-diffused field effect transistor according to claim 1,
 wherein each corner portion of the boundary is a circular arc around a corresponding vertex of the pattern of the body diffusion layer.

6. The lateral double-diffused field effect transistor according to claim 3,
 wherein a distance between the boundary and the LOCOS is constant along a direction surrounding the body diffusion layer.

7. An integrated circuit, comprising at least:
 the lateral double-diffused field effect transistor according to claim 1; and
 first-type and second-type field-effect transistors having gate insulating films having substantially a constant film thickness and having drain breakdown voltage different from each other, each transistor being formed on an common semiconductor substrate,
 wherein the film thickness of the first gate insulating film in the lateral double-diffused field effect transistor is substantially identical to the film thickness of the gate insulating film in the first-type field-effect transistor having a certain drain breakdown voltage, and
 wherein the film thickness of the second gate insulating film in the lateral double-diffused field effect transistor is substantially identical to the film thickness of the gate insulating film in the second-type field-effect transistor having a drain breakdown voltage higher than the drain breakdown voltage of the first-type field-effect transistor.

* * * * *